United States Patent [19]

Solie

[11] 4,166,228
[45] Aug. 28, 1979

[54] TEMPERATURE COMPENSATED REFLECTIVE ARRAY FOR SURFACE ACOUSTIC WAVE PROCESSING

[75] Inventor: Leland P. Solie, Acton, Mass.

[73] Assignee: Sperry Rand Corporation, New York, N.Y.

[21] Appl. No.: 887,565

[22] Filed: Mar. 17, 1978

[51] Int. Cl.² .............................................. H01L 41/10
[52] U.S. Cl. .................................... 310/313; 333/155; 333/193
[58] Field of Search ................ 310/313; 333/30 R, 72

[56] References Cited

U.S. PATENT DOCUMENTS

| | | | |
|---|---|---|---|
| 3,376,572 | 4/1968 | Mayo | 333/30 R X |
| 3,680,008 | 7/1972 | Yamamoto | 333/30 R |
| 3,790,828 | 2/1974 | Chao | 333/30 R X |
| 3,846,722 | 11/1974 | de Klerk | 333/30 R X |
| 3,883,831 | 5/1975 | Williamson | 333/30 R |
| 3,978,437 | 8/1976 | Paige | 333/30 R X |
| 3,999,147 | 12/1976 | Otto et al. | 333/30 R X |
| 4,055,820 | 10/1977 | Solie | 333/30 R |
| 4,114,119 | 9/1978 | Sandy et al. | 333/30 R |

Primary Examiner—Mark O. Budd
Attorney, Agent, or Firm—Howard P. Terry; Joseph M. Roehl

[57] ABSTRACT

An apparatus for processing surface acoustic waves includes input and output transducers mounted on a piezoelectric substrate so as to launch and receive acoustic waves, respectively. Two pairs of reflective arrays are positioned in the propagation path between the input and output transducers so as to provide an S-shaped propagation path in which the directions of propagation of the waves launched by the input transducer and received by the output transducer are essentially parallel.

10 Claims, 3 Drawing Figures

TEMPERATURE COMPENSATED REFLECTIVE ARRAY FOR SURFACE ACOUSTIC WAVE PROCESSING

BACKGROUND OF THE INVENTION

1. Field of the Invention

The present invention relates generally to surface acoustic wave signal processors and more specifically to surface acoustic wave signal processors that are relatively insensitive to ambient temperature variations.

2. Description of the Prior Art

Signal processors for surface acoustic waves are well known in the art. Typical of such signal processors are the reflective array devices used as band pass filters or pulse compression filters. Such filters are constructed on a piezoelectric substrate on which are formed input and output transducers and in which one or more reflective arrays are positioned obliquely in the propagation path between the input and output transducers. Each reflective array contains a group of parallel grooves oriented so as to provide a reflected signal nominally at right angles to the signal incident on that array.

Typical of such prior art processors are devices in which the input transducer launches a wave along the Z axis of the crystal and a single reflective array reflects the beam along the X axis toward the output transducer. Processors of this type are described, for example, in U.S. Pat. No. 4,055,820, issued in my name on Oct. 25, 1977 and assigned to the present assignee.

Variants of the above-described signal processors are also known in the art in which a pair of arrays are positioned so as to effectively reverse the direction of a launched wave and thereby provide a U-shaped propagation path.

Still another variant of the signal processor which is known in the prior art includes a first reflective array for reflecting the wave as launched by the input transducer at a right angle to the launched wave, and a second array for again reflecting the wave at a right angle so that after the second reflection the wave propagates toward the output transducer in the same direction as the originally-launched wave.

As will be explained, the characteristics of each of the above-mentioned processors are greatly influenced by the ambient temperature. The solution to the problem until this time has been to keep the substrate in a temperature controlled oven. However, this may not always be an acceptable solution because of factors such as size, cost or power requirements of the oven.

The present invention provides a means for overcoming the temperature dependency of such signal processors while at the same time minimizing the overall length of the substrate on which the processor is formed.

SUMMARY OF THE INVENTION

A temperature-insensitive, reflective array surface acoustic wave signal processor contains an even number of pairs of reflective arrays in which successive pairs of reflective arrays are arranged to effectively rotate the direction of propagation of the acoustic wave through 180 degrees in opposite directions and in which the propagation path between the individual reflective arrays in each pair is minimized.

DESCRIPTION OF THE PREFERRED EMBODIMENTS

Figure 1:
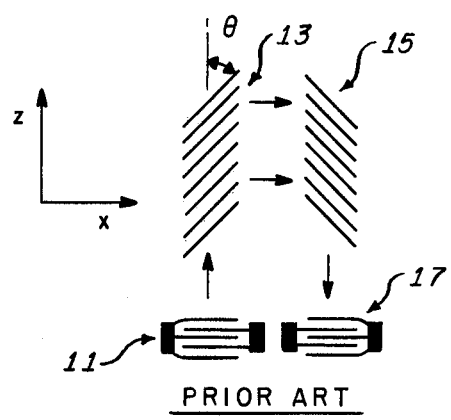
FIG. 1 is a diagram illustrating a prior art reflective array device.

FIG. 1 illustrates a prior art reflective array device in which a conventional interdigital input transducer 11 launches a surface acoustic wave upward along the Z axis of the substrate material toward a first reflective array 13.

The acoustic energy reflected from the array 13 is directed towards a second reflective array 15 from where it is again reflected downward toward an output interdigital transducer 17.

A critical design parameter in reflective array devices is the angle between the parallel grooves forming the reflective array and the direction of propagation of the incoming surface wave. This angle is illustrated as $\theta$ in FIG. 1 and is determined by the surface wave velocity in the two orthogonal directions of propagation according to the following formula:

$$V_x/V_z = \tan \theta$$

wherein $V_x$ and $V_z$ are the velocities of propagation of the acoustic waves along the X and Z axes of the substrate material, respectively.

Except for cubic crystals or others showing 90 degrees rotational symmetry, the two velocities will, in general be different and have a different dependence upon temperature. However, even though cubic crystals such as bismuth germanium oxide are sometimes used as a substrate material for reflective array devices, the overall performance of non-cubic materials such as ST-cut quartz or lithium niobate is vastly superior in such devices. Therefore, it is highly desirable to use these latter materials whenever possible.

Again referring to the device of FIG. 1, the direction of propagation of the waves reflected from the array 13 for all the standard non-cubic substrate materials such as ST-cut quartz and lithium niobate will be dependent upon the temperature of the substrate material. If the direction of propagation of the acoustic wave reflected from the array 13 in the device of FIG. 1 deviates from the X axis, the output signal from the transducer 17 will be significantly reduced as is well known in the prior art.

In addition to the temperature dependence of the reflection angle, a second temperature dependence occurs in such devices because of the variation in acoustic wave velocity as a function of temperature. This results in a variation in the timing of a compressed signal and a change in the chirp slope of linear FM filter.

Figure 2:
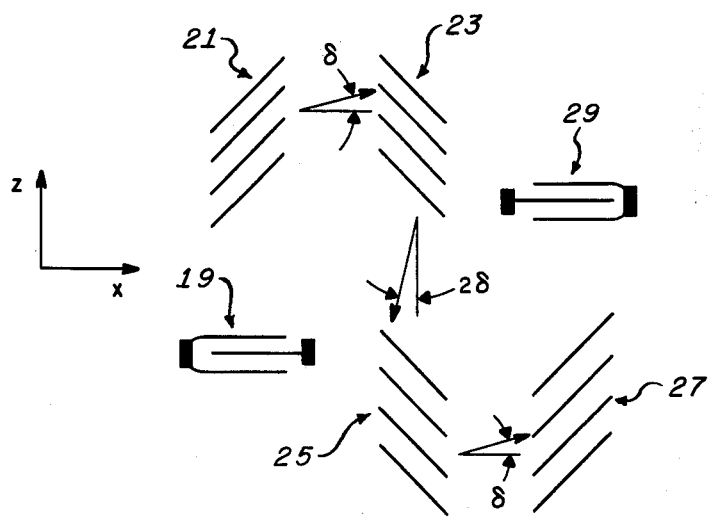
FIG. 2 is a diagram useful in explaining the operation of the present invention.

Referring now to FIG. 2, a reflective array device constructed in accordance with the principles of the present invention includes an input transducer 19 arranged to launch acoustic waves upward along the Z axis of the crystal towards a first pair of reflective arrays 21 and 23. This pair of arrays effectively reverses the direction of propagation of the wave launched by the input transducer and directs the reflected energy towards a second pair of reflective arrays comprising the individual reflective arrays 25 and 27. The second pair of arrays again reverses the direction of the acoustic wave and directs this wave upwards along the Z axis to the output transducer 29.

Assume now that the configuration of FIG. 2 is subjected to a temperature change which causes the velocity of propagation along the X axis to increase more than the corresponding increase in the velocity of propagation along the Z axis. As a result of this phenomenon, the wave reflected from the reflective array 21 will no longer propagate along the X axis, but will deviate from the X axis by a counterclockwise angle δ. When the wave from the array 21 is reflected from the second array 23, the direction of propagation of the reflected wave will deviate from the Z axis by a clockwise deviation of 2δ in that the angle of reflection of this reflected wave is influenced by the ratio of velocities and by the fact that the propagation angle of the wave incident on the array 23 is less than it would have been under ideal conditions.

It will be appreciated, that in prior art devices such as that depicted in FIG. 1, the output transducer is placed in the position occupied by the array 25 in the configuration of the invention. Thus under the assumed conditions, the acoustic wave reaching the output transducer would arrive at an angle of 2δ rather than along the Z axis and thus result in a serious decrease in the ouput signal.

Again referring to FIG. 2, the fact that the wave incident on the reflective array 25 arrives at an angle of 2δ rather than along the Z axis, would ordinarily cause the wave reflected from the array 25 to propagate at a counterclockwise angle of 2δ with respect to the X axis. However, because of the assumed differences in the velocity of propagation, the reflected wave is also subjected to a clockwise deviation δ, so that the net deviation is equal to δ in a counterclockwise direction.

The counterclockwise deviation of the wave incident on the array 27 exactly balances the deviation which would ordinarily be caused by the differences in propagation velocity associated with the array 27 so that the direction of propagation of the wave reaching the output transducer 29 remains parallel to the direction of the original wave launched from the input transducer 19 regardless of temperature variations experienced by the substrate material.

Figure 3:
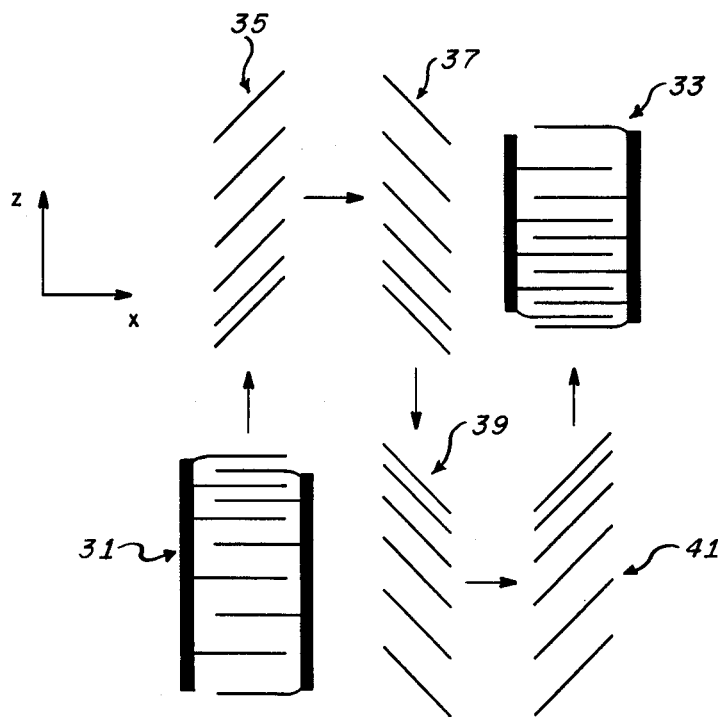
FIG. 3 is a diagram illustrating a particular type of pulse compression filter constructed in accordance with the principles of the present invention.

FIG. 3 illustrates a pulse compression filter constructed in accordance with the principles of the present invention. An interdigital input transducer 31 and interdigital output transducer 33 are positioned parallel to Z axis of the device. Each of the transducers is constructed as a dispersive device in which the distance between adjacent fingers varies as a function of position in accordance with known principles applicable to this type of device. In general, the widest spacing between adjacent fingers in each of the transducers corresponds to the wave length of the lowest frequency signal to be accommodated, whereas the smallest spacing between adjacent fingers corresponds to the wave length of the highest frequency signal to be accommodated.

As in the case of the device described in FIG. 2, the direction of the wave launched by the input transducer 31 is reversed by the first pair of reflective arrays comprising the individual arrays 35 and 37, and is again reversed by the second pair of arrays comprising the individual arrays 39 and 41 so that the reflected wave from the array 41 propagates along the Z axis of the substrate towards the output transducer 33.

The spacing between adjacent grooves in each of the reflective arrays varies with position in the same fashion as the variation in spacing between the fingers in the individual transducers so that the arrays also act as dispersive devices in accordance with known principles.

As depicted in FIG. 3, each of the transducers and each of the reflecting arrays is further arranged so that the elements having the widest spacing are positioned towards the respective ends of the crystal substrate. Thus the lowest frequency components in a given signal will traverse a significantly longer path and therefore experience a significantly greater delay than will the higher frequency components in the same signal. Assuming the differential delay in each of the transducers and each of the reflective arrays is equal, the total differential delay will be equal to six times the delay that would be experienced in a single element.

It will be appreciated that the angular deviation experienced in the device depicted in FIG. 3 will be balanced out in the same fashion as the corresponding angular deviation described with respect to FIG. 2.

It will be recalled that not only is the angle of reflection at the various arrays dependent upon temperature, but also since the velocity of propagation along the substrate material is a function of temperature, the delay experienced by a signal in traveling between the input and output transducers is also a function of temperature. In those types of processors in which such delay is critical, the problem can be minimized by the proper selection of substrate material and by properly proportioning the various segments of the propagation path.

In general, a non-cubic piezoelectric material such as ST quartz or lithium niobate would be chosen for the substrate material and the transducers would be aligned for propagation in any convenient direction for surface wave excitation. For lithium niobate, this may be Y cut with propagation in the Z crystalline axis direction and for ST-cut quartz into the X axis direction.

For the case of ST quartz, the velocity of propagation along the X axis is substantially independent of temperature, so that the only significant temperature-dependent delay that might be experienced would arise from the portion of the propagation path normal to the X axis. However, by minimizing the distance between reflective arrays in each pair of arrays in the S-shaped configuration of the present invention, the uncertainty in delay resulting from temperature variations can be substantially eliminated.

Although the foregoing description has been limited to an S-shaped configuration having two pairs of arrays, it will be appreciated that this basic configuration can be expanded so that the propagation path consists of a series of two or more S-shaped paths. In general, the invention requires that 2N pairs of reflective arrays be inserted between the input and output transducers, where N is an integer.

Because of the configuration of the propagation path wherein the acoustic wave traverses the length of the substrate several times, a highly efficient use of the substrate area can be realized. In a pulse compression filter of the type illustrated in FIG. 3 for instance, each reflective array and each transducer contributes to the total differential delay. In prior art devices wherein fewer components are utilized, the total possible differential delay is correspondingly reduced.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. Acoustic wave processing apparatus comprising:
a substrate capable of supporting surface acoustic waves on a surface thereof;
input and output transducers for launching and receiving acoustic waves, respectively, in a predetermined propagation direction on said surface; and
a plurality of 2N pairs of reflective arrays where N is an integer, said arrays being arranged serially in the propagation path between said input and output transducers, each of said arrays including a multiplicity of parallel grooves etched on said surface and oriented obliquely with respect to the direction of propagation of the surface wave incident on that array, each pair of arrays being arranged to substantially reverse the direction of propagation of surface waves incident on that pair and further arranged to provide a reflected wave that is spaced further from the input transducer than the wave incident on that pair.

2. The apparatus of claim 1 wherein two pairs of reflective arrays are inserted in the propagation path between said input and output transducers, and wherein said pairs are positioned to provide an S-shaped propagation path in which the wave launched by the input transducer is essentially parallel to the wave incident on the output transducer.

3. The apparatus of claim 2 further characterized in that each array is oriented so as to effectively rotate the wave incident on that array through an angle of nominally 90 degrees and in that the arrays in each pair are oriented so as to effectively rotate the direction of propagation of the acoustic wave in a clockwise direction in one pair and in a counterclockwise direction in the other pair.

4. The apparatus of claim 2 wherein the substrate is formed from a non-cubic piezoelectric material.

5. The apparatus of claim 4 wherein the transducers are interdigital transducers having a plurality of equally-spaced fingers and wherein each reflective array contains a plurality of equally-spaced grooves, the spacing between said fingers and the spacing between said grooves being selected to respond principally to the same acoustic wave frequency.

6. The apparatus of claim 4 wherein the substrate is formed from quartz.

7. The apparatus of claim 4 wherein the substrate is formed from lithium niobate.

8. The apparatus of claim 4 wherein the transducers and the reflective arrays are dispersive elements.

9. The apparatus of claim 8 wherein the transducers are interdigital transducers having a plurality of unequally-spaced fingers and the reflective arrays contain a plurality of unequally-spaced grooves, the greatest and the smallest spacing between adjacent fingers in each transducer and the greatest and smallest spacing between adjacent grooves in each reflective array being selected to correspond to the lowest and highest frequency component, respectively, of the acoustic wave to be accommodated.

10. The apparatus of claim 9 further characterized in that the transducers and the reflective arrays are positioned so that the fingers in each transducer and the grooves in each array having the greatest spacing are positioned nearest the respective outer edges of the substrate material, and the fingers and grooves having progressively smaller spacings are positioned progressively farther from the same edges of the substrate material, whereby the lower frequency components in an acoustic wave traverse a comparatively long propagation path whereas progressively higher frequency components traverse a progressively shorter propagation path.

* * * * *